United States Patent
Lai et al.

(10) Patent No.: US 7,537,047 B2
(45) Date of Patent: May 26, 2009

(54) LIQUID-COOLING HEAT SINK

(75) Inventors: Cheng-Tien Lai, Guangdong (CN); Zhi-Yong Zhou, Guangdong (CN)

(73) Assignees: Foxconn Technology Co., Ltd., Tu-Cheng, Taipei Hsien (TW); Fu Zhun Precision Industry (Shen Zhen) Co., Ltd., Longhua Town, Bao'an District, Shenzhen, Guangdong Province (CN)

( * ) Notice: Subject to any disclaimer, the term of this patent is extended or adjusted under 35 U.S.C. 154(b) by 372 days.

(21) Appl. No.: 11/308,426

(22) Filed: Mar. 23, 2006

(65) Prior Publication Data

US 2007/0221364 A1  Sep. 27, 2007

(51) Int. Cl.
    *H05K 7/20* (2006.01)
(52) U.S. Cl. .................. 165/80.4; 257/714; 361/699
(58) Field of Classification Search ................ 165/80.4; 361/699; 257/714
    See application file for complete search history.

(56) References Cited

U.S. PATENT DOCUMENTS

| 3,361,195 | A | * | 1/1968 | Meyerhoff et al. | ......... 165/80.4 |
| 3,882,934 | A | * | 5/1975 | Knoos et al. | ................ 165/170 |
| 5,329,419 | A | | 7/1994 | Umezawa | |
| 5,365,400 | A | * | 11/1994 | Ashiwake et al. | .......... 361/699 |
| 5,423,376 | A | | 6/1995 | Julien et al. | |
| 5,583,746 | A | * | 12/1996 | Wang | .......................... 361/697 |
| 6,014,312 | A | * | 1/2000 | Schulz-Harder et al. | .... 361/699 |
| 6,575,231 | B1 | * | 6/2003 | Wu | ............................ 361/697 |
| 6,601,643 | B2 | * | 8/2003 | Cho et al. | .............. 165/104.26 |
| 6,609,560 | B2 | * | 8/2003 | Cho et al. | .............. 165/104.26 |
| 6,634,421 | B2 | | 10/2003 | Ognibene et al. | |
| 6,719,039 | B2 | | 4/2004 | Calaman et al. | |
| 6,796,370 | B1 | | 9/2004 | Doll | |
| 7,269,011 | B2 | * | 9/2007 | Bhatti et al. | ................. 361/699 |
| 7,278,466 | B2 | * | 10/2007 | Fujisaki | ..................... 165/80.4 |
| 7,278,468 | B2 | * | 10/2007 | Joshi et al. | .................. 165/80.4 |
| 7,331,380 | B2 | * | 2/2008 | Ghosh et al. | ........... 165/104.33 |
| 2005/0103472 | A1 | * | 5/2005 | Lofland et al. | ............. 165/80.4 |
| 2006/0266498 | A1 | * | 11/2006 | Liu et al. | .................... 165/80.4 |

FOREIGN PATENT DOCUMENTS

| GB | 604464 | 7/1948 |
| JP | 2004-288809 | 10/2004 |
| TW | M250533 | 11/2004 |
| TW | M259221 | 3/2005 |
| TW | 200520187 | 6/2005 |
| TW | M268643 | 6/2005 |
| TW | M281393 | 11/2005 |

* cited by examiner

*Primary Examiner*—Leonard R Leo
(74) *Attorney, Agent, or Firm*—Winston Hsu

(57) ABSTRACT

A liquid-cooling heat sink includes a base (10), a heat exchanger (30), a housing (20), an inlet (26) and an outlet (27). The heat exchanger (30) has a hollow (33) formed therein, and is thermally coupled to the base (10). The housing (20) has a chamber (24) formed therein, and is placed over the base (10). The chamber (24) is separated by the heat exchanger (30) into a first sub-chamber (241) and a second sub-chamber (242). The first sub-chamber (241) is in fluid communication with the second sub-chamber (242) through a plurality of microchannels (32) radially formed within the heat exchanger (30). The inlet (26) is fluidly connected to the first sub-chamber (241) so as to impinge liquid coolant to a top surface of the base (10).

18 Claims, 6 Drawing Sheets

LIQUID-COOLING HEAT SINK

FIELD OF THE INVENTION

The present invention relates generally to heat sinks, and more particularly to a liquid-cooling heat sink for dissipating waste heat generated by electrical or electronic components and assemblies.

DESCRIPTION OF RELATED ART

Research activities have focused on developing heat sinks to efficiently remove heat from highly integrated heat sources such as microprocessors and computer chips.

Existing heat sinks for microelectronics components have generally used air to directly remove heat from the heat source. However, air has a relatively low heat capacity. Such heat sinks are only suitable for removing heat from relatively low power heat sources. With increase in computing speed the power density of the heat sources has increased and now require more effective heat sinks. Liquid-cooling heat sinks employing high heat capacity liquid like water and water-glycol solutions are more particularly suited to remove heat from high power density heat sources. The cooling liquid used in these heat sinks removes heat from the heat source and then transfers heat to a remote location where the heat can be easily dissipated into a flowing air stream with the use of a liquid-to-air heat exchanger. Thus, such heat sinks can be characterized as indirect heat sinks.

A typical liquid-cooling heat sink for microelectronic components generally comprises a metal block with drilled passages. The passages are connected in a serpentine pattern by means of hairpin tubes to form a continuous passage. The microelectronics components are bonded to a face of the block and liquid coolant flows through the drilled passages and the hairpin tubes. Heat sinks of this type have also used a serpentine tube mounted to one side of a block with the microelectronics components bonded onto the other side of the block. However, such heat sinks tend to be relatively heavy and thus introduce undesirably high mechanical stresses on the electronic devices being cooled and the circuit board to which the heat sink is attached.

An impingement cooling device is an alternative liquid-cooling heat sink, which has a mechanism of heat transfer by means of collision. When a jet impinges on a surface of a base, very thin hydrodynamic and thermal boundary layers are formed in the impingement region due to jet deceleration and increase in pressure. Consequently, extremely high heat transfer coefficients are obtained within the stagnation zone. For example, U.S. Pat. No. 5,329,419 discloses a cooling device for an integrated circuit package using jet impingement of liquid coolant. The cooling device includes a cooling plate in contact with the top face of a respective integrated circuit chip, a cylinder-shaped housing with an end fixed to the cooling plate, a nozzle inserted into the housing to impinge the liquid coolant onto the center of the cooling plate, and a drain tube disposed at the housing to drain the liquid coolant jet from the housing. Nevertheless, the peak heat transfer only occurs within the stagnation zone, and a single jet impingement provides an effective means where highly localized cooling is required. For applications requiring larger surface area, the average heat transfer coefficient is still low.

What is needed is a liquid-cooling heat sink using jet impingement of liquid coolant which has high cooling efficiency for applications requiring larger surface area.

SUMMARY OF INVENTION

A liquid-cooling heat sink in accordance with a preferred embodiment of the present invention includes a base, a heat exchanger, a housing, an inlet and an outlet. The heat exchanger has a hollow formed therein, and is thermally coupled to the top surface of the base. The housing has a chamber formed therein, and is placed over the base with the heat exchanger enclosed within the chamber. The chamber is separated by the heat exchanger into a first sub-chamber encircled by the heat exchanger and a second sub-chamber encircling the heat exchanger. The first sub-chamber is in fluid communication with the second sub-chamber through a plurality of microchannels formed within the heat exchanger. The inlet is fluidly connected to the first sub-chamber so as to impinge liquid coolant onto the top surface of the base. The outlet is fluidly connected to the second sub-chamber so as to drain liquid coolant from the second sub-chamber.

Other advantages and novel features will become more apparent from the following detailed description of preferred embodiments when taken in conjunction with the accompanying drawings, in which:

DETAILED DESCRIPTION

Figure 1:
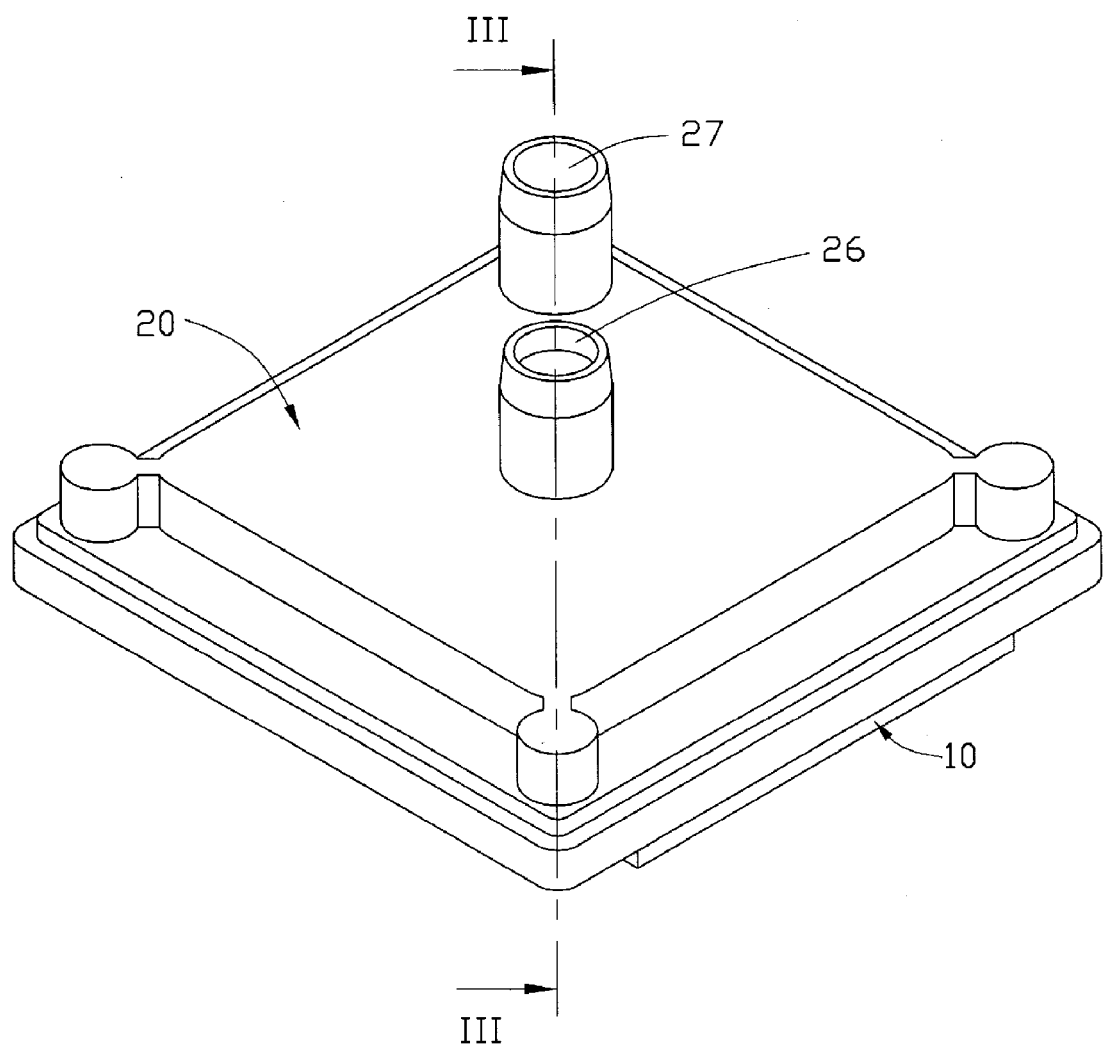
FIG. 1 an isometric view of a liquid-cooling heat sink in accordance with a preferred embodiment of the present invention.
Figure 2:
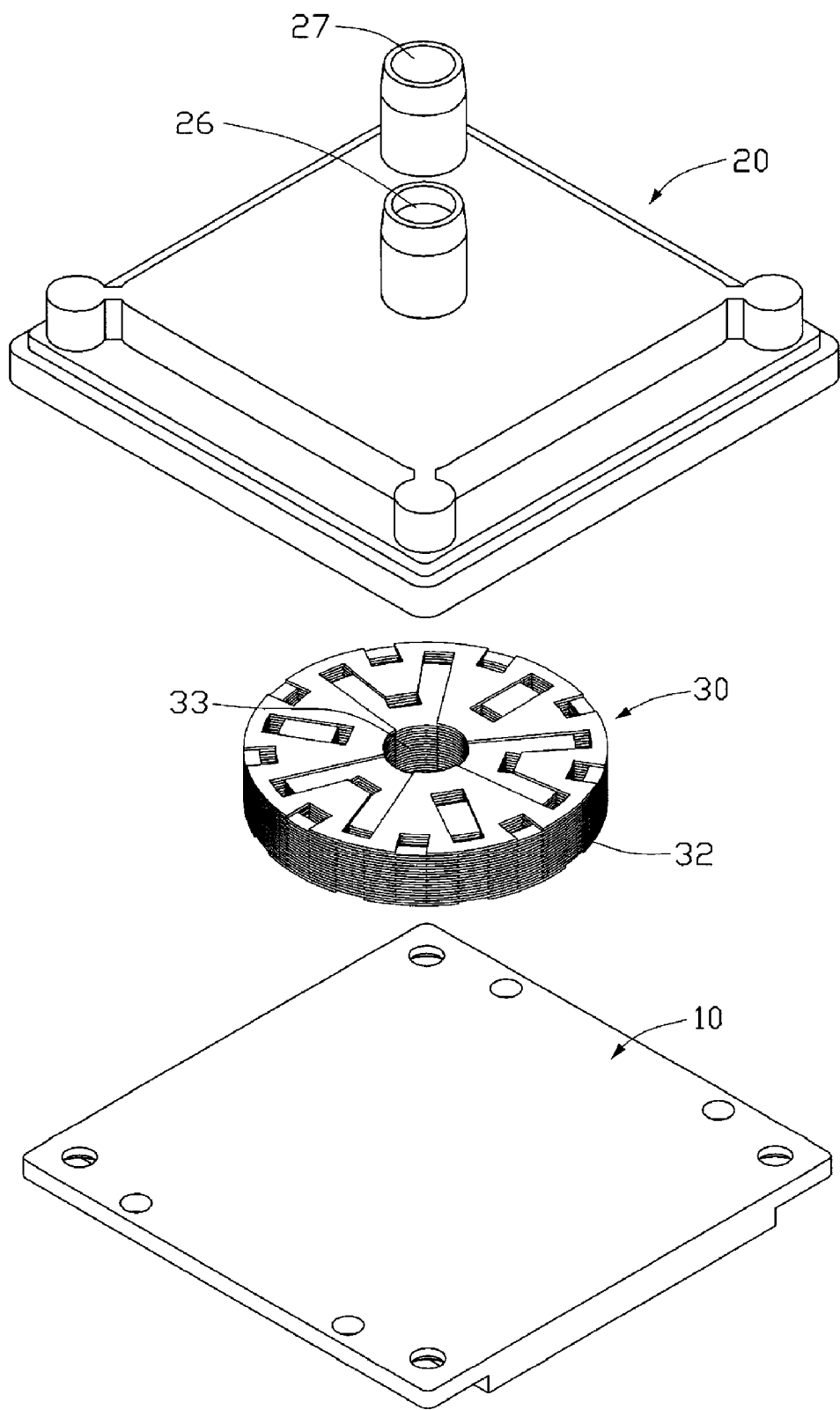
FIG. 2 is an exploded view of FIG. 1.
Figure 3:
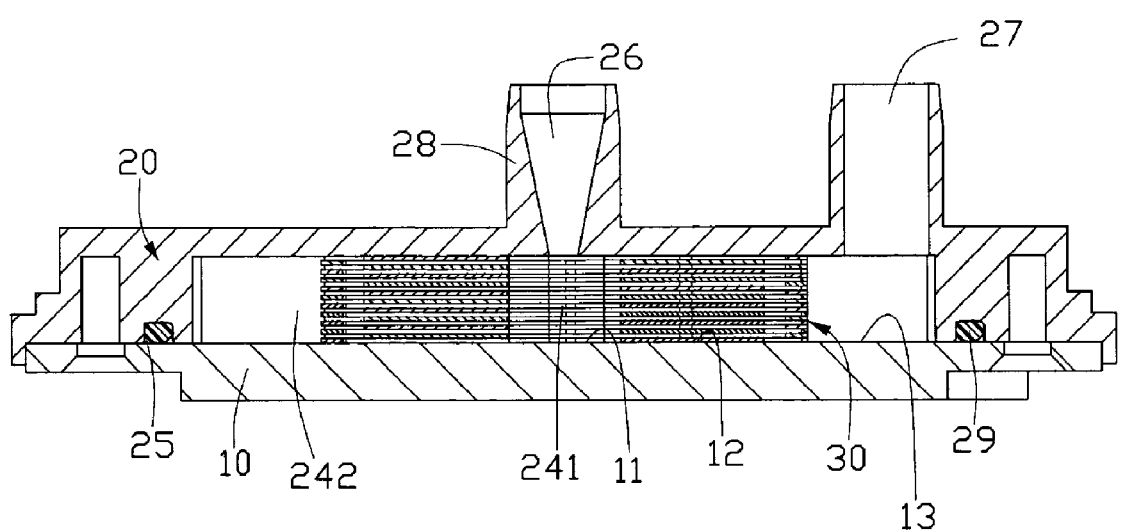
FIG. 3 is a cross-sectional view of FIG. 1, taken along line III-III thereof.
Figure 4:
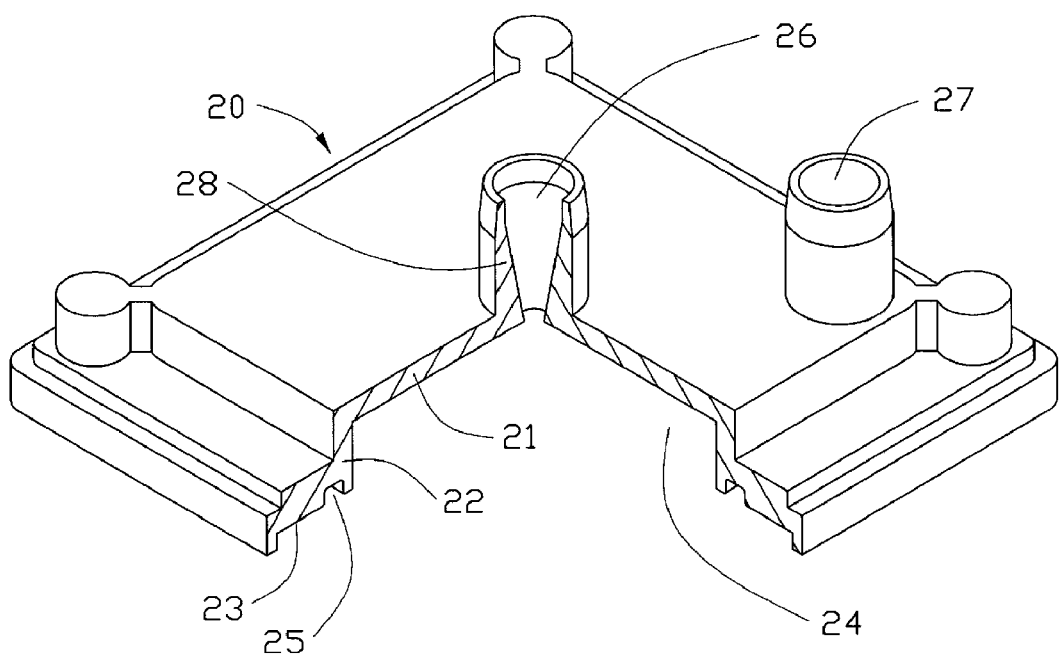
FIG. 4 is an isometric view of a housing of the liquid-cooling heat sink of FIG. 2, but having a part thereof cut away.

Referring to FIGS. 1-4, a liquid-cooling heat sink in accordance with a preferred embodiment of the present invention is especially useful in efficiently dissipating heat from highly integrated heat sources such as microprocessors or computer chips operating under high heat flux conditions. The liquid-cooling heat sink comprises a base 10, a heat exchanger 30 and a housing 20.

The base 10 is of a shape substantially rectangular or square although it is not limited to this shape. The base 10 is made of a thermally conductive material, such as copper or aluminum. The base 10 has a bottom surface 12 used for being in contact with a heat source (not shown).

The housing 20 is fastened to the base 10 by conventional fasteners such as bolts (not shown in the drawings). The housing 20 has a top wall 21 and a peripheral sidewall 22 extending downwardly from a perimeter of the top wall 21. The top wall 21 and the sidewall 22 define a chamber 24 within the housing 20. The sidewall 22 has a bottom edge surface 23 to engage the base 10. An annular slot 25 is formed within the bottom edge surface 23 so as to accommodate a sealing ring 29 for ensuring a tight liquid seal of the chamber 24. An inlet 26 and an outlet 27 are defined through the top wall 21 of the housing 20 so as to be in fluid communication with the chamber 24. A tapered nozzle 28 is provided at the inlet 26 so as to increase the jet speed of the liquid coolant in entering the chamber 24. The inlet 26 is located at a center of the top wall 21, while the outlet 27 is located at a corner of the top wall 21.

The heat exchanger 30 is disposed within the chamber 24 of the housing 20 with a bottom surface thermally coupled to a top surface of the base 10 and a top surface being in contact with a bottom surface of the top wall 21. A longitudinal cylindrical hollow 33 formed through the heat exchanger 30 is located in a position substantially perpendicular in relation to the top surface of the base 10.

The heat exchanger 30 divides the top surface of the base 10 into a first zone 11 under the hollow 33, a second zone 12 covered by the heat exchanger 30 except the hollow 33 and a third zone 13 encircling the heat exchanger 30. The first zone 11 of the top surface of the base 10 and the inner sidewall of the hollow 33 of the heat exchanger 30 define the first sub-chamber 241 encircled by the heat exchanger 30. The third zone 13 of the top surface of the base 10 and the outer sidewall of the heat exchanger 30 together with the sidewall 22 of the housing 20 define a second sub-chamber 242 encircling the heat exchanger 30. The first sub-chamber 241 is fluidly connected to the inlet 26 so that coolant jet from the inlet 26 can be directly impinged onto the first zone 11, and the second sub-chamber 242 is fluidly connected to the outlet 27 so that coolant collected within the second sub-chamber 242 can be drained out. The first sub-chamber 241 and the second sub-chamber 242 are in fluid communication with each other through a plurality of microchannels 32 formed within the heat exchanger 30.

Figure 5:
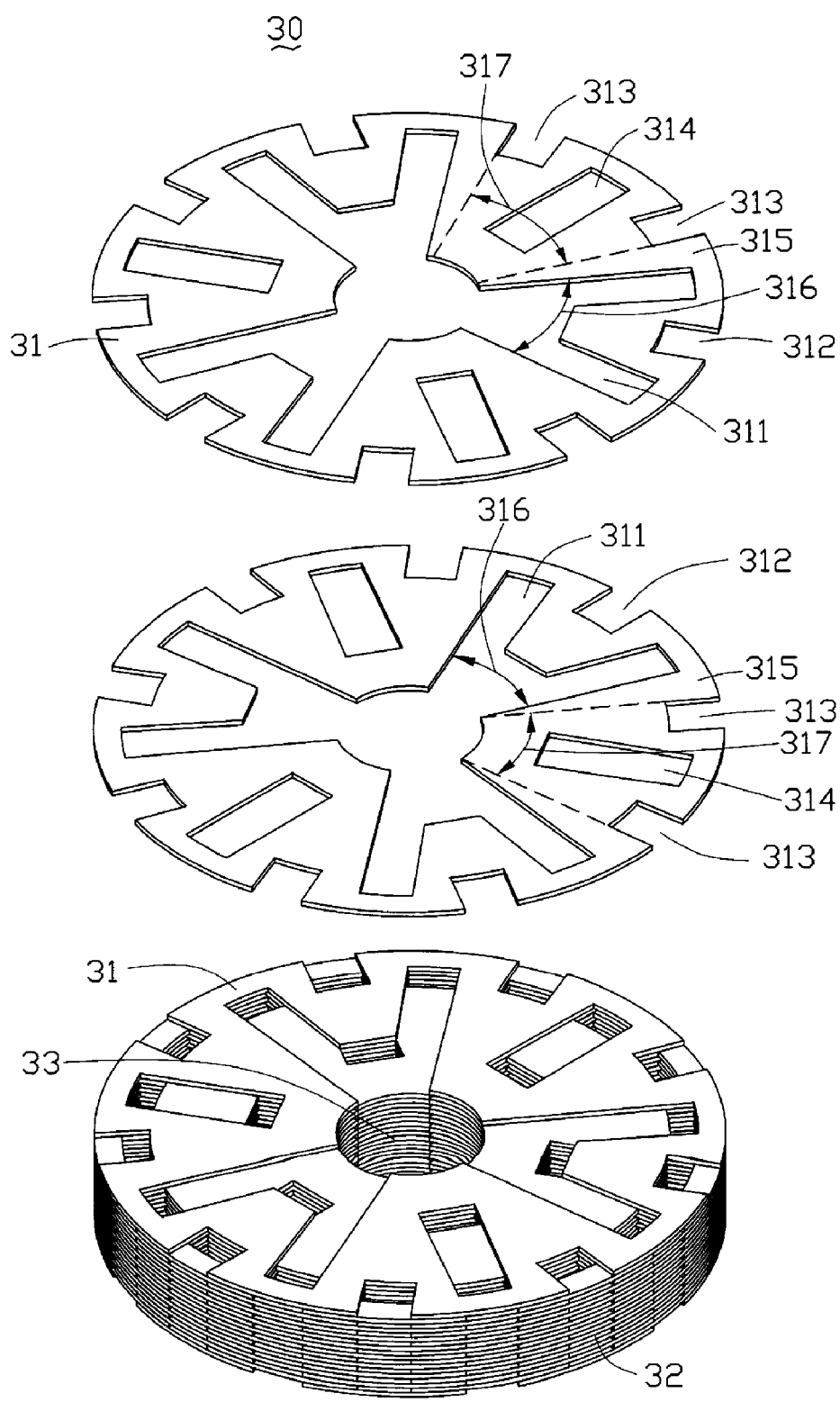
FIG. 5 is a partially exploded view of a heat exchanger of the liquid-cooling heat sink of FIG. 2.

Referring to FIG. 5, the heat exchanger 30 is substantially cylinder-shaped, and comprises a plurality of superposed annular plates 31. The plates 31 are made of thermal conductive material such as copper or aluminum. Each plate 31 has a plurality of first perforate sectors 316 a plurality of second perforate sectors 317 and a plurality of solid connection portions 315 which connect the first perforate sectors 316 with the second perforate sectors 317. The perforate sectors 316 and the perforate sectors 317 are arranged in a circle alternately.

The annular plates 31 are coaxially stacked one on another in a staggered manner, wherein the odd-numbered plates 31 and the even-numbered plates 31 are arranged at different angles (orientations). The first perforate sectors 316 and the second perforate sectors 317 of each plate 31 are respectively confronted with the second perforate sectors 317 and the first perforate sectors 316 of an adjacent plate 31 so as to form the microchannels 32. The solid connection portions 315 of each plate 31 are mechanically and thermally coupled to the solid connection portions 315 of the adjacent plate 31 so as to conduct heat from the base 10 to top of the heat exchanger 30.

Each first perforate sector 316 has a first perforate portion 311 fluidly connected to the first sub-chamber 241 and a second perforate portion 312 fluidly connected to the second sub-chamber 242. Each second perforate sector 317 has a third perforate portion 313 fluidly connected to the second sub-chamber 242 and a fourth perforate portion 314. The perforate portions 311, 312 and 313 are unbounded, and the fourth perforate portion 314 is bounded. The first perforate portion 311 has a V-shaped profile.

The perforate portions 311, 312, 313 and 314 are confronted with corresponding solid portions of two adjacent plates 31, and lengths of the perforate portions 311, 312, 313 and 314 as measured in the direction of coolant flow (i.e., radial direction) are greater than those of the corresponding solid portions of the two adjacent plates 31 so as to form the microchannels 32. Each first perforate portion 311 of each first perforate sector 316 of each plate 31 is in fluid communication with the third perforate portion 313 of each second perforate sector 317 of the adjacent plate 31. Each first and second perforate portion 311 and 312 of each first perforate sector 316 of each plate 31 is in fluid communication with each other through the fourth perforate portion 314 of the second perforate sector 317 of the adjacent plate 31.

During operation, heat generated by a heat source (not shown) is first conducted to the base 10. Then a first part of the heat is transferred to the liquid coolant from the first zone 11 of the top surface of base 10, as the liquid coolant is impinged onto the first zone 11. At the same time, a second part of heat is conducted to the heat exchanger 30 from the second zone 12 of the base 10. The second part of heat is transferred to the liquid coolant as the liquid coolant flows into the second sub-chamber 242 from the first sub-chamber 241 via the pluralities of microchannels 32. A third part of heat is transferred to the liquid coolant from the third zone 13 of the top surface of the base 10 as the liquid coolant flows in the second sub-chamber 242. Finally, the heated liquid coolant is delivered to a remote cooler (not shown) via the outlet 27, and then returned to perform another working cycle after being cooled.

Figure 6:
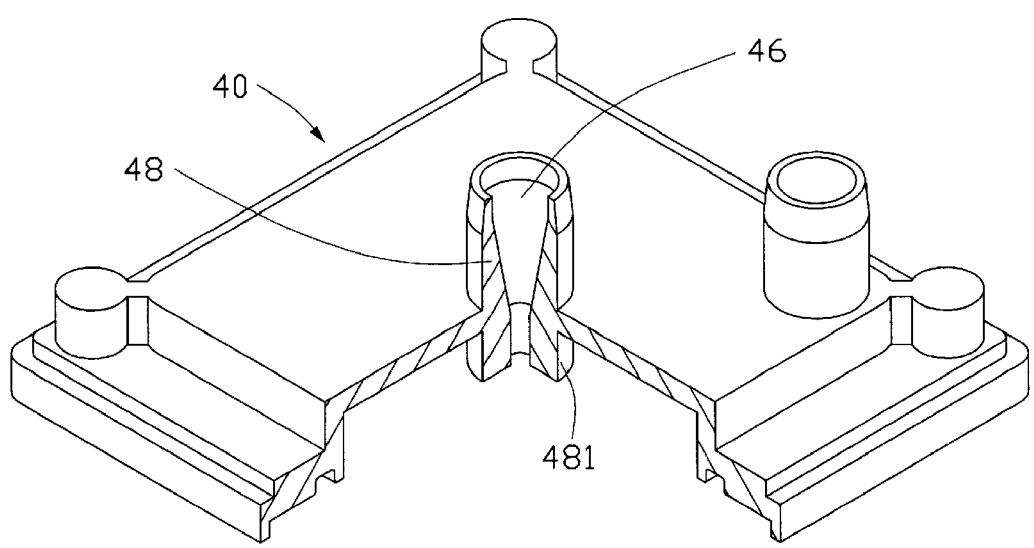
FIG. 6 is an isometric view of a housing of a liquid-cooling heat sink in accordance with an alternative embodiment of the present invention, but having a part thereof cut away.

Referring to FIG. 6, a housing 40 in an alternative embodiment of the present invention is provided. The housing 40 has a tapered nozzle 48 disposed at the inlet 46. The nozzle 48 has a prolongation 481 extending into the chamber of the housing 40. Various lengths of the prolongation 481 may be allowed according to the required distance between the inlet 46 and the base 10 so as to optimize the heat exchanging efficiency of the coolant.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A liquid-cooling heat sink comprising:
   a base;
   a heat exchanger having a hollow formed therein, the heat exchanger being thermally coupled to a top surface of the base;
   a housing having a chamber formed therein, the housing being placed over the base with the heat exchanger enclosed within the chamber, the chamber being separated by the heat exchanger into a first sub-chamber encircled by the heat exchanger and a second sub-chamber encircling the heat exchanger, the first sub-chamber being in fluid communication with the second sub-chamber through a plurality of microchannels formed within the heat exchanger;
   an inlet fluidly connected to the first sub-chamber so as to impinge liquid coolant onto the top surface of the base; and
   an outlet fluidly connected to the second sub-chamber so as to drain liquid coolant from the second sub-chamber;
   wherein the heat exchanger includes a plurality of annular plates coaxially stacked one on another, each annular plate having a plurality of first perforate sectors and a plurality of second perforate sectors arranged alternately.

2. The liquid-cooling heat sink as claimed in claim 1, wherein the hollow of the heat exchanger is cylinder-shaped, and is substantially perpendicular to the top surface of the base.

3. The liquid-cooling heat sink as claimed in claim 1, wherein the top surface of the base is divided by the heat exchanger into a first zone under the hollow of the heat exchanger, a second zone covered by the heat exchanger except the hollow and a third zone encircling the heat exchanger.

4. The liquid-cooling heat sink as claimed in claim 3, wherein the first zone of the top surface of the base together with the hollow of the heat exchanger defines the first sub-chamber.

5. The liquid-cooling heat sink as claimed in claim 3, wherein the third zone of the top surface of the base together with an outer sidewall of the heat exchanger and an inner sidewall of the chamber defines the second sub-chamber.

6. The liquid-cooling heat sink as claimed in claim 1, wherein the plurality of annular plates are stacked in a staggered manner such that the plurality of first perforate sectors of each annular plate are confronted with the plurality of second perforate sectors of an adjacent annular plate.

7. The liquid-cooling heat sink as claimed in claim 6, wherein each first perforate sector has at least one first perforate portion fluidly connected to the first sub-chamber, and each second perforate sector has a third perforate portion fluidly connected to the second sub-chamber.

8. The liquid-cooling heat sink as claimed in claim 7, wherein the at least one first perforate portion of each annular plate is fluidly connected to the at least one third perforate portion of an adjacent annular plate.

9. The liquid-cooling heat sink as claimed in claim 6, wherein each first perforate sector has at least one first perforate portion fluidly connected to the first sub-chamber and at least one second perforate portion fluidly connected to the second sub-chamber, and each second perforate sector has a fourth perforate portion.

10. The liquid-cooling heat sink as claimed in claim 9, wherein the at least one first and second perforate portions of each first perforate sector of each annular plate are fluidly communicated with each other through the fourth perforate portion of the second perforate sector of an adjacent annular plate.

11. The liquid-cooling heat sink as claimed in claim 1, wherein a tapered nozzle is disposed at the inlet.

12. The liquid-cooling heat sink as claimed in claim 11, wherein the nozzle has a prolongation extending into the first sub-chamber.

13. A heat exchanger comprising:
a plurality of annular plates, each annular plate having a plurality of first perforate sectors and a plurality of second perforate sectors arranged alternately;
wherein the plurality of annular plates are coaxially stacked one on another in a staggered manner, such that the plurality of first perforate sectors of each annular plate are positioned relative to the plurality of second perforate sectors of an adjacent annular plate so as to form a plurality of microchannels communicating an interior with an exterior of the heat exchanger.

14. The heat exchanger as claimed in claim 13, wherein each first perforate sector has at least one first unbounded perforate portion, and each second perforate sector has at least one third unbounded perforate portion.

15. The heat exchanger as claimed in claim 14, wherein the at least one first perforate portion of each first perforate sector of each annular plate is fluidly connected to the at least one third unbounded perforate portion of each second perforate sector of an adjacent annular plate.

16. The heat exchanger as claimed in claim 13, wherein each first perforate sector has at least one first unbounded perforate portion and at least one second unbounded perforate portion, and each second perforate sector has a fourth bounded perforate portion.

17. The heat exchanger as claimed in claim 16, wherein the at least one first and second unbounded perforate portions of each first perforate sector are in fluid communication with each other through the fourth bounded perforate portion of the second perforate sector of an adjacent annular plate.

18. The heat exchanger as claimed in claim 13, wherein the first perforate portion has a V-shaped profile.

* * * * *